(12) United States Patent
Xu et al.

(10) Patent No.: US 7,598,183 B2
(45) Date of Patent: Oct. 6, 2009

(54) BI-LAYER CAPPING OF LOW-K DIELECTRIC FILMS

(75) Inventors: Ping Xu, Fremont, CA (US); Christopher Dennis Bencher, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 226 days.

(21) Appl. No.: 11/533,505

(22) Filed: Sep. 20, 2006

(65) Prior Publication Data
US 2008/0070421 A1 Mar. 20, 2008

(51) Int. Cl.
H01L 21/00 (2006.01)

(52) U.S. Cl. .................. 438/778; 438/789; 438/761; 438/430

(58) Field of Classification Search .......... 438/689, 438/739, 761, 778, 789, 430, 935
See application file for complete search history.

(56) References Cited

U.S. PATENT DOCUMENTS

| 5,906,042 | A | 5/1999 | Lan et al. |
| 6,303,523 | B2 | 10/2001 | Cheung et al. |
| 6,504,379 | B1 | 1/2003 | Jackson |
| 6,511,903 | B1 * | 1/2003 | Yau et al. ............ 438/623 |
| 6,511,909 | B1 | 1/2003 | Yau et al. |
| 6,537,733 | B2 | 3/2003 | Campana et al. |
| 6,566,278 | B1 | 5/2003 | Harvey et al. |
| 6,597,003 | B2 | 7/2003 | Janos et al. |
| 6,614,181 | B1 | 9/2003 | Harvey et al. |
| 6,756,085 | B2 | 6/2004 | Waldfried et al. |
| 6,759,321 | B2 | 7/2004 | Babich et al. |
| 6,759,327 | B2 | 7/2004 | Xia et al. |
| 6,893,985 | B2 | 5/2005 | Goodner |
| 6,913,992 | B2 | 7/2005 | Schmitt et al. |
| 6,936,551 | B2 * | 8/2005 | Moghadam et al. ......... 438/780 |
| 7,060,330 | B2 | 6/2006 | Zheng et al. |
| 7,098,149 | B2 | 8/2006 | Lukas et al. |
| 7,112,541 | B2 | 9/2006 | Xia et al. |
| 7,226,876 | B2 | 6/2007 | Schmitt et al. |
| 7,259,111 | B2 | 8/2007 | Padhi et al. |
| 2002/0000670 | A1 | 1/2002 | Yau et al. |
| 2003/0015669 | A1 | 1/2003 | Janos et al. |
| 2003/0054115 | A1 | 3/2003 | Albano et al. |

(Continued)

OTHER PUBLICATIONS

International Search Report and Written Opinion of the International Searching Authority, mailed Mar. 25, 2008 (PCT/US07/79020).

*Primary Examiner*—Thanh V Pham
*Assistant Examiner*—Caleb Henry
(74) *Attorney, Agent, or Firm*—Patterson & Sheridan, LLP

(57) ABSTRACT

A method is provided for processing a substrate surface by delivering a first gas mixture comprising a first organosilicon compound, a first oxidizing gas, and one or more hydrocarbon compounds into a chamber at deposition conditions sufficient to deposit a first low dielectric constant film on the substrate surface. A second gas mixture having a second organosilicon compound and a second oxidizing gas is delivered into the chamber at deposition conditions sufficient to deposit a second low dielectric constant film on the first low dielectric constant film. The flow rate of the second oxidizing gas into the chamber is increased, and the flow rate of the second organosilicon compound into the chamber is decreased to deposit an oxide rich cap on the second low dielectric constant film.

9 Claims, 3 Drawing Sheets

U.S. PATENT DOCUMENTS

| | | |
|---|---|---|
| 2003/0139035 A1 | 7/2003 | Yim et al. |
| 2004/0058090 A1 | 3/2004 | Waldfried et al. |
| 2004/0096593 A1 | 5/2004 | Lukas et al. |
| 2004/0096672 A1 | 5/2004 | Lukas et al. |
| 2004/0099283 A1 | 5/2004 | Waldfried et al. |
| 2004/0101633 A1 * | 5/2004 | Zheng et al. ................ 427/551 |
| 2004/0147109 A1 | 7/2004 | Yau et al. |
| 2004/0150096 A1 | 8/2004 | Purushothaman et al. |
| 2004/0175501 A1 | 9/2004 | Lukas et al. |
| 2004/0175929 A1 | 9/2004 | Schmitt et al. |
| 2004/0175957 A1 | 9/2004 | Lukas et al. |
| 2004/0192058 A1 | 9/2004 | Chu et al. |
| 2005/0037153 A1 | 2/2005 | Schmitt et al. |
| 2005/0064726 A1 | 3/2005 | Reid et al. |
| 2005/0156317 A1 | 7/2005 | Yau et al. |
| 2005/0208759 A1 | 9/2005 | Schmitt et al. |
| 2005/0250346 A1 | 11/2005 | Schmitt |
| 2005/0250348 A1 | 11/2005 | Xia et al. |
| 2006/0014397 A1 | 1/2006 | Seamons et al. |
| 2006/0097359 A1 | 5/2006 | Goodner |
| 2006/0160376 A1 | 7/2006 | Padhi et al. |
| 2006/0270221 A1 | 11/2006 | M'Saad et al. |
| 2006/0276054 A1 | 12/2006 | Xu et al. |
| 2007/0141855 A1 | 6/2007 | Schmitt et al. |
| 2008/0042077 A1 | 2/2008 | Schmitt |
| 2008/0044557 A1 | 2/2008 | Yau et al. |
| 2008/0061439 A1 | 3/2008 | Yau et al. |
| 2008/0064225 A1 | 3/2008 | Yau et al. |

* cited by examiner

BI-LAYER CAPPING OF LOW-K
DIELECTRIC FILMS

BACKGROUND OF THE INVENTION

1. Field of the Invention

Embodiments of the present invention generally relate to the fabrication of integrated circuits. More particularly, the embodiments relates to methods for depositing dielectric layers on a substrate and structures that include the dielectric layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 µm and even 0.1 µm feature sizes, and tomorrow's plants soon will be producing devices having even smaller geometries.

In order to further reduce the size of devices on integrated circuits, it has become necessary to use conductive materials having low resistivity and to use insulators having low dielectric constants to reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process. However, the continued reduction in device geometries has generated a demand for films having even lower k values.

Recent developments in low dielectric constants have focused on incorporating silicon, carbon, and oxygen atoms into the deposited film. One challenge in this area has been to develop a Si, C, and O containing film that has a low k value, but also exhibits desirable thermal and mechanical properties. Most often, films made of a Si, C, and O network that have a dielectric constant lower than 2.5 exhibit lower mechanical strength and may be damaged by etch chemistry and subsequent plasma exposure, causing failure of the integrated circuit.

Therefore, there is a need for a process for making low dielectric constant materials that would improve the speed and efficiency of devices on integrated circuits as well as the durability and mechanical integrity of the integrated circuit.

SUMMARY OF THE INVENTION

Embodiments of the present invention generally provide a method for depositing a low dielectric constant film. In one embodiment, the method provides processing a substrate surface by delivering a first gas mixture having a first organosilicon compound, a first oxidizing gas, and one or more hydrocarbon compounds into a chamber at deposition conditions sufficient to deposit a first low dielectric constant film on the substrate surface. A second gas mixture having a second organosilicon compound and a second oxidizing gas is then delivered into the chamber at deposition conditions sufficient to deposit a second low dielectric constant film on the first low dielectric constant film. A flow rate of the second oxidizing gas into the chamber is increased and a flow rate of the second organosilicon compound into the chamber is decreased to deposit an oxide rich cap on the second low dielectric constant film.

In a further embodiment, the method of processing a substrate surface includes delivering a gas mixture having a first organosilicon compound, an oxidizing gas, and one or more hydrocarbon compounds having at least one cyclic group into a chamber and depositing a first low dielectric constant film on the substrate surface in the presence of RF power. The RF power is turned off after the first low dielectric constant film is deposited, and the first low dielectric constant film is cured. A gas mixture having a second organosilicon compound and a second oxidizing gas is delivered into the chamber to deposit a second low dielectric constant film on the first low dielectric constant film in the presence of RF power. The RF power is turned off after the second low dielectric constant film is deposited. A flow rate of the second oxidizing gas into the chamber is increased and a flow rate of the second organosilicon compound into the chamber is decreased to deposit an oxide rich cap on the second low dielectric constant film.

In a further embodiment, a low dielectric constant film having improved strength is obtained by capping a dielectric constant film having a dielectric constant of about 2.5 or less with a bi-layered cap. The bi-layered cap has a second low dielectric film with a dielectric constant in the range of between about 2.5 and about 3.5 and an oxide rich cap.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
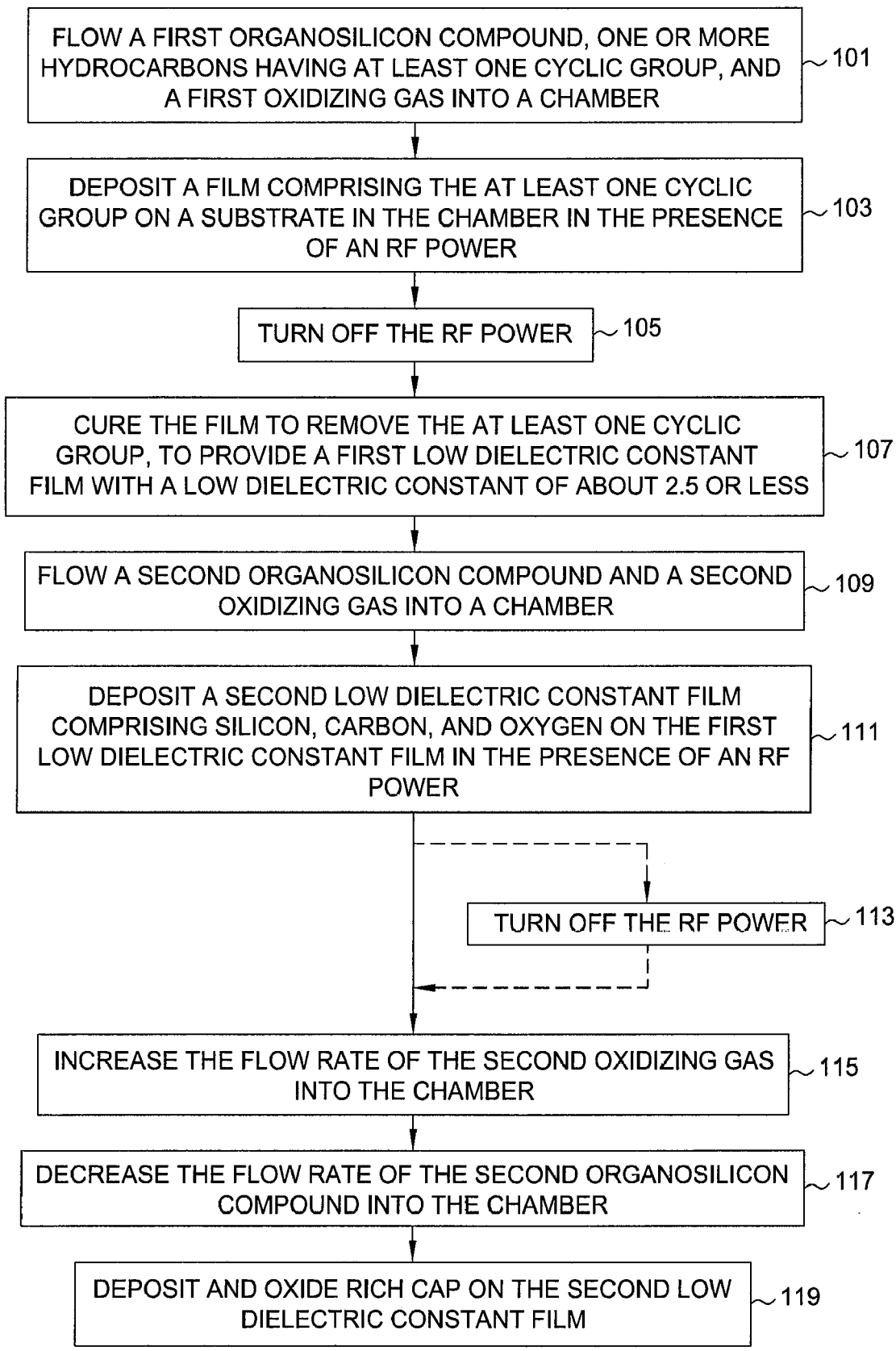
FIG. 1 is a process flow diagram illustrating a method for forming a bi-layer capped low dielectric film according to an embodiment of the invention.

FIG. 1 is a process flow diagram illustrating a method for forming a structure having a low dielectric constant film capped by a bi-layer of a low dielectric film and an oxide rich cap according to an embodiment of the invention. In step 101 a first organosilicon compound, one or more hydrocarbons having at least one cyclic group, and a first oxidizing gas are flowed into a chamber. In step 103, a film comprising the at least one cyclic group is deposited on a substrate in the chamber from a mixture comprising the organosilicon compound and the one or more hydrocarbons in the presence of RF power. In step 105, the RF power in the chamber is turned off. In step 107, the film comprising the at least one cyclic group is cured to remove the at least one cyclic group and to provide a first low dielectric constant film. The first low dielectric constant film may have a low dielectric constant of about 2.5 or less.

In step 109, a second organosilicon compound and a second oxidizing gas are flowed into a chamber. In step 111, a second low dielectric constant film comprising silicon, carbon, and oxygen is deposited on the first low dielectric constant film from a mixture comprising the second organosilicon compound and the second oxidizing gas in the presence of RF power comprising low frequency RF power (LFRF). The RF power may also comprise high frequency RF power. In optional step 113, the low frequency RF power and high frequency RF power in the chamber may be turned off turned off.

In step 115, the flow rate of the second oxidizing gas into the chamber is increased. In step 117, the flow rate of the second organosilicon compound into the chamber is decreased. In step 119, an oxide rich cap is deposited on the second low dielectric constant film. The oxide rich cap may be deposited in the presence of high frequency RF power and low frequency RF power used to deposit the second low dielectric constant film. Embodiments of the invention summarized in FIG. 1 will be described in more detail below.

Figure 2A:
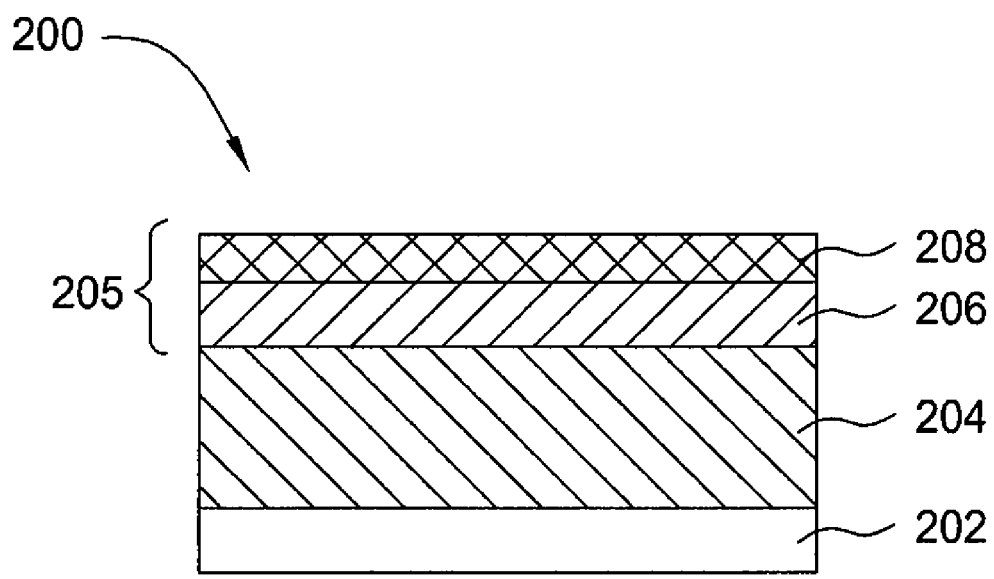
FIG. 2A is a cross-sectional view of a structure including a bi-layer cap and a low dielectric constant film formed according to embodiments of the invention.
Figure 2B:
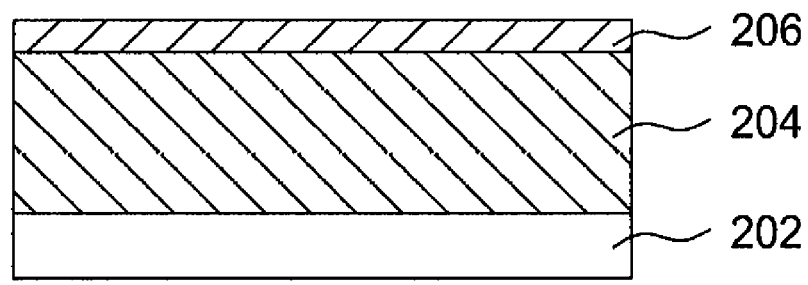
FIG. 2B is a cross-sectional view of the structure including a polished cap and a low dielectric constant film formed according to embodiments of the invention.

FIG. 2A schematically illustrates a cross-sectional view of a structure including layers formed according to embodiments of the invention. Structure 200 includes a first low dielectric constant film 204 that is deposited on a substrate 202 according to embodiments of the invention. The substrate 202 may be a conductive, semiconductive, or insulating layer. The first low dielectric constant film 204 may be deposited to a thickness between about 100 nm and about 1000 nm, preferably, between about 300 nm and about 700 nm. The first low dielectric constant film 204 may have a dielectric constant of about 2.5 or less, preferably, about 2.2 or less. A bi-layer capping film 205 is deposited on the first low dielectric constant film 204. The bi-layer capping film 205 may consist of a second low dielectric constant film 206 deposited on the first low dielectric constant film and an oxide rich cap 208 that is deposited on the second low dielectric constant film 206. The second low dielectric constant film 206 may be deposited to a thickness of between about 50 nm and about 500 nm, preferably, between about 100 nm and about 200 nm. The second low dielectric constant film 206 may have a dielectric constant of between about 2.5 and about 3.5. In one embodiment, the dielectric constant of the second low dielectric constant film may be about 3. The oxide rich cap 208 may be deposited on the second low dielectric constant film 206 such that the second low dielectric constant film 206 and the oxide rich cap 208 are adjacent, i.e., the second low dielectric constant film 206 and the oxide rich cap 208 contact each other. The oxide rich cap 208 may be deposited to a thickness between about 50 nm and about 500 nm, preferably, between about 100 nm and about 200 nm. In FIG. 2B, the oxide rich cap 208 and the second low dielectric constant film have been planarized, resulting in the removal of the oxide rich cap and a reduction in thickness of the second low dielectric constant film 206.

The term "organosilicon compound" as used herein is intended to refer to compounds containing carbon atoms in organic groups, and can be cyclic or linear. Organic groups may include alkyl, alkenyl, cyclohexenyl, and aryl (what others) groups in addition to functional derivatives thereof. Preferably, the organosilicon compounds includes one or more carbon atoms attached to a silicon atom whereby the carbon atoms are not readily removed by oxidation at suitable processing conditions. The organosilicon compounds may also preferably include one or more oxygen atoms.

Suitable cyclic organosilicon compounds include a ring structure having three or more silicon atoms, and optionally one or more oxygen atoms. Commercially available cyclic organosilicon compounds include rings having alternating silicon and oxygen atoms with one or two alkyl groups bonded to the silicon atoms. Some exemplary cyclic organosilicon compounds include:

Suitable linear organosilicon compounds include aliphatic organosilicon compounds having linear or branched structures with one or more silicon atoms and one or more carbon atoms. The organosilicon compounds may further include one or more oxygen atoms. Some exemplary linear organosilicon compounds include:

| | |
|---|---|
| methylsilane, | $CH_3$—$SiH_3$ |
| dimethylsilane, | $(CH_3)_2$—$SiH_2$ |
| trimethylsilane (TMS), | $(CH_3)_3$—$SiH$ |
| ethylsilane, | $CH_3$—$CH_2$—$SiH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| diethoxymethylsilane (DEMS), | $CH_3$—$SiH$—$(O$—$CH_2$—$CH_3)_2$ |
| 1,3-dimethyldisiloxane, | $CH_3$—$SiH_2$—$O$—$SiH_2$—$CH_3$ |
| 1,1,3,3-tetramethyldisiloxane, | $(CH_3)_2$—$SiH$—$O$—$SiH$—$(CH_3)_2$ |
| hexamethyldisiloxane (HMDS), | $(CH_3)_3$—$Si$—$O$—$Si$—$(CH_3)_3$ |
| 1,3-bis(silanomethylene)disiloxane, | $(SiH_3$—$CH_2$—$SiH_2$—$)_2$—$O$ |
| bis(1-methyldisiloxanyl)methane, | $(CH_3$—$SiH_2$—$O$—$SiH_2$—$)_2$—$CH_2$ |
| 2,2-bis(1-methyldisiloxanyl)propane, | $(CH_3$—$SiH_2$—$O$—$SiH_2$—$)_2$—$C(CH_3)_2$ |
| hexamethoxydisiloxane (HMDOS) | $(CH_3O)_3$—$Si$—$O$—$Si$—$(OCH_3)_3$ |
| dimethyldimethoxysilane (DMDMOS) | $(CH_3O)_2$—$Si$—$(CH_3)_2$ |
| dimethoxymethylvinylsilane (DMMVS) | $(CH_3O)_2$—$Si$—$(CH_3)$—$CH_2$=$CH_3$ |

The term "cyclic group" as used herein is intended to refer to a ring structure. The ring structure may contain as few as three atoms. The atoms may include carbon, silicon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. Further, the cyclic group is preferably bonded to a linear or branched functional group. The linear or branched functional group preferably contains an alkyl or vinyl alkyl group and has between one and twenty carbon atoms. The linear or branched functional group may also include oxygen atoms, such as a ketone, ether, and ester. Some exemplary compounds having at least one cyclic group include alpha-terpinene (ATP), norbornadiene, vinylcyclohexane (VCH), and phenylacetate.

Suitable oxidizing gasses include oxygen ($O_2$), ozone ($O_3$), nitrous oxide ($N_2O$), carbon monoxide (CO), carbon dioxide ($CO_2$), water ($H_2O$), 2,3-butanedione or combinations thereof. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the

| | |
|---|---|
| 1,3,5-trisilano-2,4,6-trimethylene, | —(—$SiH_2CH_2$—$)_3$-(cyclic) |
| 1,3,5,7-tetramethylcyclotetrasiloxane (TMCTS) | —(—$SiHCH_3$—$O$—$)_4$-(cyclic) |
| octamethylcyclotetrasiloxane (OMCTS), | —(—$Si(CH_3)_2$—$O$—$)_4$-(cyclic) |
| 1,3,5,7,9-pentamethylcyclopentasiloxane, | —(—$SiHCH_3$—$O$—$)_5$-(cyclic) |
| 1,3,5,7-tetrasilano-2,6-dioxy-4,8-dimethylene, | —(—$SiH_2$—$CH_2$—$SiH_2$—$O$—$)_2$-(cyclic) |
| hexamethylcyclotrisiloxane | —(—$Si(CH_3)_2$—$O$—$)_3$-(cyclic) | amount of ozone desired and the type of ozone generating equipment used. Disassociation of oxygen or the oxygen containing compounds may occur in a microwave chamber prior to entering the deposition chamber to reduce excessive dissociation of the silicon containing compounds. Preferably, radio frequency (RF) power is applied to the reaction zone to increase dissociation.

One or more carrier gases may be introduced into the chamber in addition to the organosilicon compound and the oxidizing gas. Carrier gases that may be used include inert gases such as argon, helium, and combinations thereof.

Figure 3:
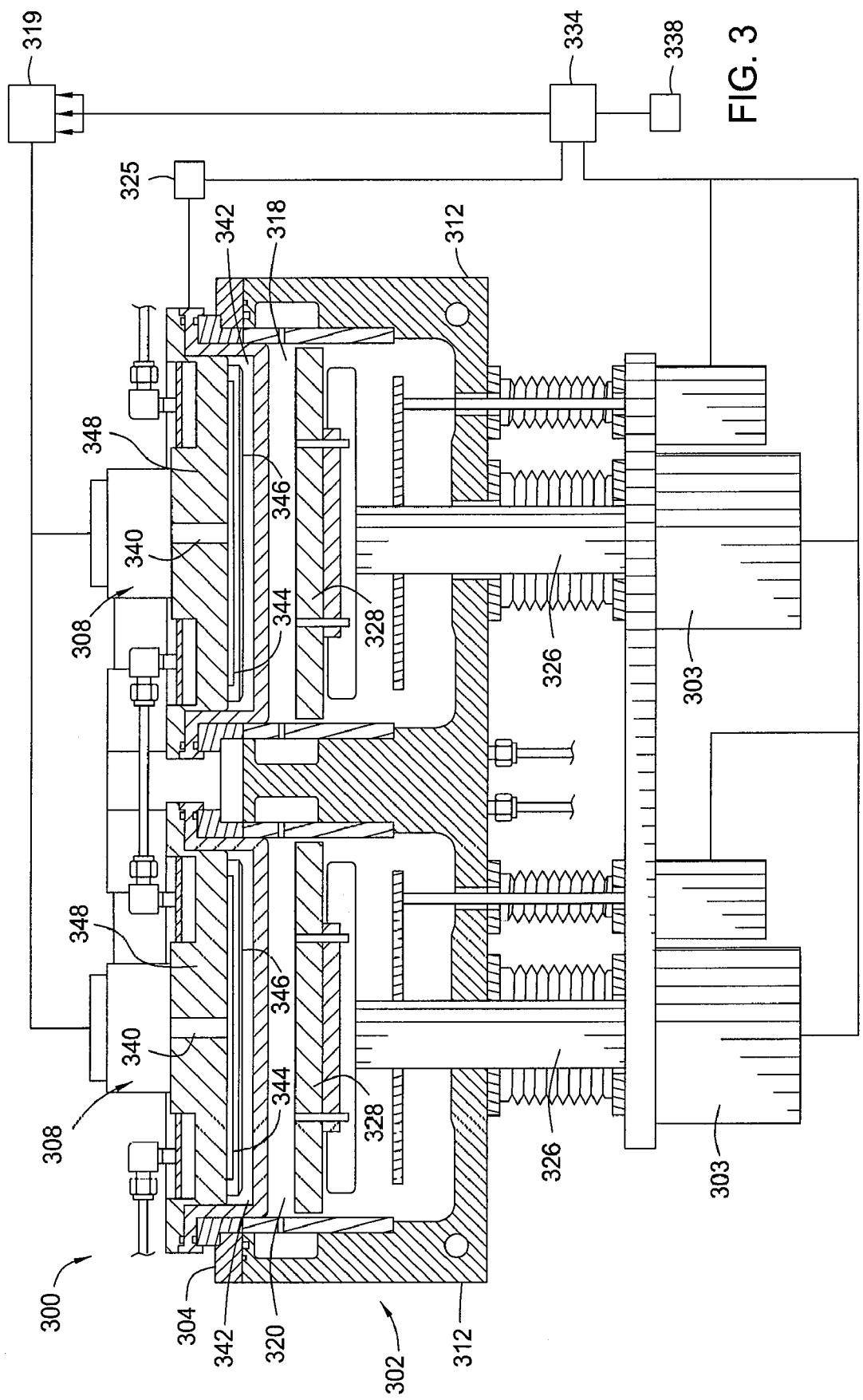
FIG. 3 is a cross-sectional, schematic diagram of an apparatus according to an embodiment of the invention.

FIG. 3 is a cross-sectional, schematic diagram of a chemical vapor deposition (CVD) chamber 300 for depositing layers according to embodiments of the invention. An example of such a chamber is a dual or twin chamber on a PRODUCER® system, available from Applied Materials, Inc. of Santa Clara, Calif. The twin chamber has two isolated processing regions (for processing two substrates, one substrate per processing region) such that the flow rates experienced in each region are approximately one half of the flow rates into the whole chamber. The flow rates described in the examples below and throughout the specification are the flow rates per 300 mm substrate. A chamber having two isolated processing regions is further described in U.S. Pat. No. 5,855,681, which is incorporated by reference herein. Another example of a chamber that may be used is a DxZ® chamber on a CENTURA® system, both of which are available from Applied Materials, Inc.

The CVD chamber 300 has a chamber body 302 that defines separate processing regions 318, 320. Each processing region 318, 320 has a pedestal 328 for supporting a substrate (not shown) within the CVD chamber 300. Each pedestal 328 typically includes a heating element (not shown). Preferably, each pedestal 328 is movably disposed in one of the processing regions 318, 320 by a stem 326 which extends through the bottom of the chamber body 302 where it is connected to a drive system 303.

Each of the processing regions 318, 320 also preferably includes a gas distribution assembly 308 disposed through a chamber lid 304 to deliver gases into the processing regions 318, 320. The gas distribution assembly 308 of each processing region normally includes a gas inlet passage 340 which delivers gas from a gas flow controller 319 into a gas distribution manifold 342, which is also known as a showerhead assembly. Gas flow controller 319 is typically used to control and regulate the flow rates of different process gases into the chamber. Other flow control components may include a liquid flow injection valve and liquid flow controller (not shown) if liquid precursors are used. The gas distribution manifold 342 comprises an annular base plate 348, a face plate 346, and a blocker plate 344 between the base plate 348 and the face plate 346. The gas distribution manifold 342 includes a plurality of nozzles (not shown) through which gaseous mixtures are injected during processing. An RF (radio frequency) source 325 provides a bias potential to the gas distribution manifold 342 to facilitate generation of a plasma between the showerhead assembly and the pedestal 328. During a plasma-enhanced chemical vapor deposition process, the pedestal 328 may serve as a cathode for generating the RF bias within the chamber body 302. The cathode is electrically coupled to an electrode power supply to generate a capacitive electric field in the CVD chamber 300. Typically an RF voltage is applied to the cathode while the chamber body 302 is electrically grounded. Power applied to the pedestal 228 creates a substrate bias in the form of a negative voltage on the upper surface of the substrate. This negative voltage is used to attract ions from the plasma formed in the CVD chamber 300 to the upper surface of the substrate.

During processing, process gases are uniformly distributed radially across the substrate surface. The plasma is formed from one or more process gases or a gas mixture by applying RF energy from the RF power supply 325 to the gas distribution manifold 342, which acts as a powered electrode. Film deposition takes place when the substrate is exposed to the plasma and the reactive gases provided therein. The chamber walls 312 are typically grounded. The RF power supply 325 can supply either a single or mixed-frequency RF signal to the gas distribution manifold 342 to enhance the decomposition of any gases introduced into the processing regions 318, 320.

A system controller 334 controls the functions of various components such as the RF power supply 325, the drive system 303, the lift mechanism 305, the gas flow controller 319, and other associated chamber and/or processing functions. The system controller 334 executes system control software stored in a memory 338, which in the preferred embodiment is a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes, and other plasma processing chambers may also be employed for practicing embodiments of the invention.

During deposition on a 300 mm substrate, a controlled plasma is typically formed in the chamber adjacent to the substrate by RF energy applied to the showerhead using an RF power supply 325 as depicted in FIG. 3. Alternatively, RF power can be provided to the substrate support. The plasma may be generated using high frequency RF (HFRF) power, as well as low frequency RF (LFRF) power (e.g., dual frequency RF), constant RF, pulsed RF, or any other known or yet to be discovered plasma generation technique. The RF power supply 325 can supply a single frequency RF between about 5 MHz and about 300 MHz. In addition, the RF power supply 325 may also supply a single frequency LFRF between about 300 Hz and about 1,000 kHz to supply a mixed frequency to enhance the decomposition of reactive species of the process gas introduced into the process chamber. The RF power may be cycled or pulsed to reduce heating of the substrate and promote greater porosity in the deposited film. Suitable RF power may be a power in a range between about 10 W and about 5,000 W, preferably in a range between about 200 W and about 1000 W. Suitable LFRF power may be a power in a range between about 0 W and about 5,000 W, preferably in a range between about 0 W and about 200 W.

During deposition, the substrate is maintained at a temperature between about −20° C. and about 500° C., preferably between about 100° C. and about 450° C. The spacing between the substrate and the manifold may be between about 200 mils and about 1200 mils. The deposition pressure is typically between about 1 Torr and about 20 Torr, preferably between about 4 Torr and about 10 Torr. The deposition rate is typically between about 2,000 Å/min. and about 20,000 Å/min.

A process for depositing the first low dielectric constant film 204 on substrate 202, as depicted in FIGS. 2A and 2B, is described in commonly assigned U.S. Pat. No. 7,060,330, entitled "Method for forming ultra low k films using electron beam", issued to Zheng et al., which is incorporated by reference herein.

Returning to step 101, the first organosilicon compound may be introduced into the chamber at a flow rate in a range between about 50 mg/min. and about 5,000 mg/min., preferably between about 300 mg/min. and about 3,000 mg/min. The one or more hydrocarbons may be introduced into the chamber at a flow rate in a range between about 10 mg/min. and about 5,000 mg/min., preferably between about 1000 mg/min. and about 4,000 mg/min. The flow of oxidizing gas may be added in a range between about 1000 sccm and about 2,000 sccm.

In one embodiment, the first organosilicon compound may include diethoxymethylsilane (DEMS) with a flow rate in a range between about 600 mg/min. and about 800 mg/min., the one or more hydrocarbons may include alpha-terpinene (ATP) with a flow rate in a range between about 3000 mg/min. and about 45,000 mg/min., and the oxidizing gas may include carbon dioxide with a flow rate in a range between about 1000 sccm and about 2000 sccm.

In another embodiment, the first organosilicon compound may include DEMS with a flow rate in a range between about 600 mg/min. and about 800 mg/min. and octamethylcyclotetrasiloxane (OMCTS) with a flow rate of about 200 mg/min.

In another embodiment, the first organosilicon compound may include DEMS with a flow rate in a range between about 600 mg/min. and about 800 mg/min. and trimethylsilane (TMS) with a flow rate in a range between about 500 mg/min. and about 1000 mg/min.

In another embodiment, the first organosilicon compound may include DEMS with a flow rate in a range between about 600 mg/min. and about 800 mg/min., OMCTS with a flow rate of about 200 mg/min. and TMS with a flow rate in a range between about 500 mg/min. and about 1000 mg/min.

In another embodiment, the first oxidizing gas, in addition to carbon dioxide, may include oxygen flowed at a flow rate in a range between about 100 sccm and about 200 sccm.

Returning to step 107, curing the deposited film of step 103 may be performed by several methods, such as a thermal or plasma enhanced annealing process, an electron beam process, or an ultraviolet curing process. In one embodiment, the film is annealed at a temperature between about 200° C. and about 400° C. for about 2 seconds to about 1 hour, preferably about 30 minutes. A non-reactive gas such as helium, hydrogen, nitrogen, or a mixture thereof is introduced at a rate of 100 to about 10,000 sccm. The chamber pressure is maintained between about 2 Torr and about 10 Torr. The RF power during the annealing is about 200 W to about 1,000 W at a frequency of about 13.56 MHz, and the preferable substrate spacing is between about 300 mils and about 800 mils. Annealing the film at a substrate temperature between about 200° C. and about 400° C. after the film is deposited volatilizes at least some of the organic groups in the film, forming voids in the film. Organic groups that may be volatilized are derived from organic components of the gas mixtures described herein, such as the ring of the one or more oxygen-free hydrocarbon compounds comprising one ring and one or two carbon-carbon double bonds in the ring.

In another embodiment, the film is post-treated with an electron beam treatment. The e-beam treatment typically has a dose between about 50 and about 2000 micro coulombs per square centimeter ($\mu c/cm^2$) at about 1 to 20 kiloelectron volts (KeV). The e-beam treatment is typically operated at a temperature between about room-temperature and about 450° C. for about 1 minute to about 15 minutes, such as about 2 minutes. Preferably, the e-beam treatment is performed at about 400° C. for about 2 minutes. In one aspect, the e-beam treatment conditions include 4.5 kV, 1.5 mA and 150 $\mu c/cm^2$ at 400° C. Although any e-beam device may be used, one exemplary device is the EBK chamber, available from Applied Materials, Inc.

The e-beam curing process improves mechanical strength of the deposited film network and also lowers the k-value. The energized e-beam alters the chemical bonding in the molecular network of the deposited film and removes at least a portion of the molecular groups, such as organic components from the ring of the one or more oxygen-free hydrocarbon compounds comprising one ring and one or two carbon-carbon double bonds in the ring, from the film. The removal of the molecular groups creates voids or pores within the film, lowering the k value. The e-beam treatment also strengthens the film network by cross-linking Si—O—Si or Si—C—Si chains as inferred from FTIR spectroscopy.

In another embodiment, the film is cured by an ultraviolet curing process. Low dielectric constant films cured using the ultraviolet curing process have shown improved barrier layer properties and have shown reduced and minimal resist poisoning. The ultraviolet curing process may be performed in situ within the same processing chamber or system, for example, transferred from one chamber to another without a break in vacuum.

The substrate is introduced into a chamber, which may include the deposition chamber, and the low dielectric constant film is exposed to between about 0.01 milliWatts/cm$^2$ and about 1 watts/cm$^2$ of ultraviolet radiation, for example, between about 0.1 milliWatts/cm$^2$ and about 10 milliwatts/cm$^2$. The ultraviolet radiation may comprise a range of ultraviolet wavelengths, and include one or more simultaneous wavelengths. Suitable ultraviolet wavelengths include between about 1 nm and about 400 nm, and may further include optical wavelengths up to about 600 or 780 nm. The ultraviolet wavelengths between about 1 nm and about 400 nm, may provide a photon energy (electroVolts) between about 11.48 (eV) and about 3.5 (eV). Preferred ultraviolet wavelengths include between about 100 nm and about 350 nm.

Further, the ultraviolet radiation may be applied at multiple wavelengths, a tunable wavelength emission and tunable power emission, or a modulation between a plurality of wavelengths as desired, and may be emitted from a single UV lamp or applied from an array of ultraviolet lamps. Examples of suitable UV lamps include a Xe filled Zeridex™ UV lamp, which emits ultraviolet radiation at a wavelength of about 172 nm or the Ushio Excimer UV lamp, or a Hg Arc Lamp, which emits ultraviolet radioation at wave. The deposited silicon carbide layer is exposed to the ultraviolet radiation for between about 10 seconds and about 600 seconds.

During processing, the temperature of the processing chamber may be maintained at between about 0° C. and about 450° C., for example, between about 20° C. and about 400° C. degrees Celsius, for example about 25° C., and at a chamber pressure between vacuum, for example, less than about 1 mTorr up to about atmospheric pressure, i.e., 760 Torr, for example at about 100 Torr. The source of ultraviolet radiation may be between about 100 mils and about 600 mils from the substrate surface. Optionally, a processing gas may be introduced during the ultraviolet curing process. Suitable processing gases include oxygen ($O_2$), nitrogen ($N_2$), hydrogen ($H_2$), helium (He), argon (Ar), water vapor ($H_2O$), carbon monoxide, carbon dioxide, hydrocarbon gases, fluorocarbon gases, and fluorinated hydrocarbon gases, or combinations thereof. The hydrocarbon compounds may have the formula $C_XH_Y$, $C_XF_Y$, $C_XF_YH_Z$, or combinations thereof, with x an integer from 1 to 6, y is an integer from 4 to 14, and z is an integer from 1 to 3.

A process for depositing the second low dielectric constant film 206 and oxide rich cap 208, as depicted in FIG. 2A, is described in commonly assigned U.S. patent application Ser. No. 11/145,432, filed Jun. 3, 2005, which is incorporated by reference herein.

Returning to step 109, the second organosilicon compound may be introduced into the chamber at a flow rate between about 50 sccm and about 1000 sccm, e.g., 102 sccm, and maintained at that flow rate during the deposition of the second low dielectric constant layer. The second oxidizing compound may be introduced into the chamber at a flow rate between about 50 sccm and about 2000 sccm and maintained at that flow rate during the deposition of the low dielectric constant layer (step 111). Optionally, a carrier gas is also flowed into the chamber at a flow rate between about 500 sccm and about 5000 sccm during steps 109 and 111.

In one embodiment, the second organosilicon compound may be OMCTS, the second oxidizing gas may be oxygen, and the carrier gas may be helium.

The second low dielectric constant film may be deposited in the presence of RF power comprising low frequency RF power (LFRF). The RF power may be applied to a gas distribution manifold or showerhead in the chamber, wherein the showerhead acts as a powered electrode. Alternatively, or additionally, RF power can be provided to the substrate support in the chamber, with the substrate support serving as a cathode in the chamber. The RF power to the chamber may be cycled or pulsed to reduce heating of the substrate and promote greater porosity in the deposited film. The low frequency RF (LFRF) power has a frequency of about 200 kHz to about 2 MHz and may have a power level between about 50 W and about 1000 W for a 300 mm substrate. The RF power may also comprise high frequency RF power having a frequency between about 500 kHz and about 13.56 MHz. The power level of the high frequency RF power may be between about 50 W and about 3000 W for a 300 mm substrate.

After the second low dielectric constant film is deposited, the RF power in the chamber may optionally be turned off, as shown in optional step 113. Alternatively, the RF power may be maintained in the chamber such that plasma conditions are maintained in the chamber after the deposition of the low dielectric constant film.

The flow rate of the second oxidizing gas into the chamber is increased and the flow rate of the second organosilicon compound into the chamber is decreased after the deposition of the second low dielectric constant film. While the termination of the low frequency RF power, the flow rate increase of the second oxidizing gas, and the flow rate decrease of the second organosilicon compound are shown as sequential steps, 113, 115, 117, preferably, the termination of the low frequency RF power, the flow rate increase of the second oxidizing gas, and the flow rate decrease of the second organosilicon compound are preferably performed simultaneously or substantially simultaneously. However, alternative orders of steps 113, 115, 117 may be used.

The flow rate of the second oxidizing gas may be increased from a flow rate between about 50 sccm and about 2000 sccm during the deposition of the low dielectric constant film to a flow rate between about 400 sccm and about 5000 sccm. The flow rate of the second organosilicon compound may be decreased from a flow rate between about 50 sccm and about 1000 sccm during the deposition of the second low dielectric constant film to a flow rate between about 5 sccm and about 100 sccm.

In one embodiment, the second oxidizing gas flow rate and the second organosilicon compound flow rate are changed such that the second organosilicon compound to second oxidizing gas flow rate ratio is changed from between about 1:1 and about 3:1 during the deposition of the second dielectric constant film to between about 1:75 and about 1:10 such that the oxide rich cap is deposited at a second organosilicon compound to second oxidizing gas flow rate ratio of between about 1:75 and about 1:10.

The flow rate of the carrier gas may be increased from a flow rate between about 500 sccm and about 5000 sccm during the deposition of the second low dielectric constant film to a flow rate between about 1000 sccm and about 10000 sccm after the deposition of the second low dielectric constant film.

After the flow rates of the second oxidizing gas, second organosilicon compound, and optional carrier gas are changed, the flow rates of the second oxidizing gas, second organosilicon compound, and optional carrier gas are maintained for a period of time sufficient to deposit an oxide rich cap on the second low dielectric constant film, as shown in step 111. The period of time may be between about 2 seconds and about 200 seconds. The oxide rich cap may have a thickness between about 10 nm and about 300 nm. Preferably, the substrate temperature, chamber pressure, spacing between the substrate and the manifold, and the high frequency RF power are maintained during the deposition of the oxide rich cap at the levels used during the deposition of the second low dielectric constant film.

Embodiments of the invention described herein provide a method of depositing a first low dielectric constant film having a bi-layered cap deposited thereon. The bi-layered cap has a second low dielectric constant film with an oxide rich cap thereon. By depositing the second low dielectric constant film from a mixture comprising a second organosilicon compound and a second oxidizing gas and then increasing the flow of the second oxidizing gas and decreasing the flow of the second organosilicon compound, an oxide rich cap having a lower carbon content than the second low dielectric constant film is provided. The bi-layered cap may function as a protective or sacrificial layer for the underlying low dielectric constant films during subsequent processing steps, such as chemical mechanical polishing (CMP). The CMP process may remove the oxide layer of the bi-layer and partially remove and planarize the second low dielectric constant layer without damage to the first low dielectric constant film underneath, and the dielectric value of the resulting two low dielectric constant layers may not significantly increase because the remaining capping film is a low dielectric constant film, as opposed to if only a single oxide layer were used as a capping layer. The bi-layer cap may also eliminate resist poisoning, serve as an ash protest layer to prevent damage to the first low dielectric constant film during an ash process. Chemical mechanical polishing may be performed using conventional CMP techniques.

While the foregoing is directed to embodiments of the present invention, other and further embodiments of the invention may be devised without departing from the basic scope thereof, and the scope thereof is determined by the claims that follow.

The invention claimed is:

1. A method of processing a substrate, comprising:
 delivering a first gas mixture comprising a first organosilicon compound, an oxidizing gas, and one or more hydrocarbon compounds having at least one cyclic group into a chamber;
 depositing a first low dielectric constant film on the substrate in the presence of RF power;
 turning off the RF power after the first low dielectric constant film is deposited;
 curing the first low dielectric constant film;

delivering a second gas mixture comprising a second organosilicon compound and a second oxidizing gas into the chamber;

depositing a second low dielectric constant film on the first low dielectric constant film in the presence of RF power;

turning off the RF power after the second low dielectric constant film is deposited;

increasing a flow rate of the second oxidizing gas into the chamber;

decreasing a flow rate of the second organosilicon compound into the chamber; and depositing an oxide rich cap on the second low dielectric constant film.

2. The method of claim 1, wherein the first low dielectric constant film has a dielectric constant of about 2.5 or less and the second low dielectric constant film has a dielectric constant in the range of between about 2.5 and about 3.5.

3. The method of claim 1, further comprising curing and planarizing the oxide rich cap and the second low dielectric constant film.

4. The method of claim 1, wherein the first organosilicon compound is selected from the group consisting of 1,3,5-trisilano-2,4,6-trimethylene, 1,3,5,7-tetramethyl-cyclotetrasiloxane, octamethylcyclotetrasiloxane, 1,3,5,7,9-pentamethylcyclopentasiloxane, 1,3,5,7-tetrasilano-2,6-dioxy-4,8-dimethylene, hexamethylcyclotrisiloxane, diethoxymethylsilane, dimethyl, dimethoxysilane, dimethoxymethylvinylsilane, trimethylsilane, derivatives thereof, and mixtures thereof.

5. The method of claim 1, wherein the first organosilicon compound comprises diethoxymethylsilane.

6. The method of claim 1, wherein the second organosilicon compound is octamethylcyclotetrasiloxane or trimethylsilane.

7. The method of claim 1, wherein the one or more hydrocarbon compounds having at least one cyclic group is selected from the group consisting of alpha-terpinene, vinylcyclohexane, norbornadiene, phenylacetate, and combinations thereof.

8. The method of claim 5, wherein the second organosilicon compound is octamethylcyclotetrasiloxane and the one or more hydrocarbon compounds is alpha-terpinene or norbornadiene.

9. The method of claim 1, wherein the first and second oxidizing gases are selected from the group consisting of oxygen, ozone, carbon dioxide, carbon monoxide, water, nitrous oxide, and 2,3-butanedione.

* * * * *